United States Patent [19]

Harigane et al.

[11] Patent Number: 4,578,010
[45] Date of Patent: Mar. 25, 1986

[54] ELECTRONIC COMPONENT SELECTION AND SUPPLY APPARATUS IN AUTOMATIC ELECTRONIC COMPONENT INSERTING MACHINE

[75] Inventors: Kotaro Harigane; Keiichi Ihara; Tetsuro Ito; Hirokazu Shudo, all of Tokyo, Japan

[73] Assignee: TDK Corporation, Japan

[21] Appl. No.: 437,329

[22] Filed: Oct. 28, 1982

[30] Foreign Application Priority Data

Oct. 31, 1981 [JP] Japan .................................. 56-173702
Nov. 16, 1981 [JP] Japan ............................. 56-169518[U]
Nov. 20, 1981 [JP] Japan ............................. 56-172155[U]

[51] Int. Cl.$^4$ ............................................. H05K 3/30
[52] U.S. Cl. ..................................... 414/126; 29/741; 414/226
[58] Field of Search .......................... 29/739, 741, 742; 414/126, 128, 226

[56] References Cited

U.S. PATENT DOCUMENTS 2,914,843  12/1959  Petersen ............................ 29/741 X
4,006,829   2/1977  Tokunaga ........................ 414/226 X
4,294,000  10/1981  Takahashi et al. ................. 29/564.6
4,327,483   5/1982  Zemek et al. ........................ 29/741
4,329,776   5/1982  Mori et al. ............................ 29/741

FOREIGN PATENT DOCUMENTS 782638  9/1957  United Kingdom .................. 29/741

Primary Examiner—Joseph E. Valenza
Assistant Examiner—Janice Krizek
Attorney, Agent, or Firm—Steinberg & Raskin

[57] ABSTRACT

An electronic component selection and supply apparatus for use in an automatic electronic component inserting machine for automatically inserting electronic components of irregular shapes which are unsuitable for taping, such as electrolytic capacitors, power transistors and variable resistors, into a printed circuit board includes selection and supply apparatus for selecting an electronic component at a first position and supplying the selected component to a second position, the apparatus including electronic component sequence apparatus for selecting a predetermined electronic component which includes a device for vertically holding a plurality of electronic component magazines accommodating the electronic components at predetermined positions in a stacked state, and chuck apparatus for receiving the predetermined electronic component selected by the electronic component sequence apparatus and for supplying the electronic component to the second position.

15 Claims, 13 Drawing Figures

ELECTRONIC COMPONENT SELECTION AND SUPPLY APPARATUS IN AUTOMATIC ELECTRONIC COMPONENT INSERTING MACHINE

BACKGROUND OF THE INVENTION

1. Field of the Invention

The present invention relates to an electronic component selection and supply apparatus for use in an automatic electronic component inserting machine for automatically inserting electronic components of irregular shapes unsuitable for taping such as electrolytic capacitors, power transistors or variable resistors into a printed circuit board.

2. Description of the Prior Art

There is known in the prior art an automatic electronic component inserting machine for automatically inserting electronic components such as resistors or capacitors into a printed circuit board by means of a taping technique shown in U.S. Pat. No. 4,243,139, as disclosed in U.S. Pat. No. 4,054,988 or in U.S. Pat. No. 4,263,708. However, the electronic components of irregular shapes such as electrolytic capacitors, power transistors or variable resistors, the bodies of which have large diameters, are either unsuitable or impossible for the taping disclosed in the above-identified U.S. Pat. No. 4,243,139 so that they cannot be inserted by such an automatic electronic component inserting machine as disclosed in the U.S. Pat. No. 4,054,988 or 4,263,708.

SUMMARY OF THE INVENTION

Taking the aforementioned point into consideration, therefore, the present invention provides an electronic component selection and supply apparatus for use in an automatic electronic component inserting machine which can automatically insert such irregularly shaped electronic components without any taping by means of an absolutely novel mechanism.

According to the present invention, there is provided, in a machine for processing and inserting electronic components into lead receiving openings in a printed circuit board, a selection and supply apparatus for selecting an electronic component at a first position and supplying said selected electronic component to a second predetermined position, comprising: electronic component sequence means for selecting a predetermined electronic component, including means for vertically holding a plurality of electronic component magazines accommodating the electronic components at predetermined positions in stacked states; and chuck means for receiving the predetermined electronic component which was selected by said electronic component sequence means and for supplying said electronic component to said second predetermined position.

In a preferred embodiment of the present invention, said electronic component sequence means further includes: an intermittent rotary shaft; electronic component magazine holders for holding said plurality of electronic component magazines at predetermined angular spacings to rotate them together with said intermittent rotary shaft; and pockets at predetermined angular spacings to communicate with the lower openings of said plural electronic component magazines.

In the embodiment, moreover, said chuck means includes: a first chuck for gripping the body of said electronic component to extract the same from the corresponding one of said pockets and moving the same to an intermediate position; and a second chuck for gripping, at the intermediate position, the lead of the electronic component, which was extracted from said first chuck, to supply the same to said second predetermined position.

In the embodiment, still moreover, said first chuck has a pair of grip levers for gripping the body of said electronic component and is made movable in the longitudinal direction of the corresponding one of said electronic component magazines, and said second chuck has a pair of grip levers for gripping the leads of the electronic component which has its body gripped by said first chuck, and is made swingable and movable in a direction which is perpendicular to the longitudinal direction of the corresponding one of said electronic component magazines.

BRIEF DESCRIPTION OF THE DRAWINGS

A more complete appreciation of the present invention and many of the attendant advantages thereof will be readily understood by reference to the following detailed descriptions when considered in connection with the accompanying drawings in which.

DESCRIPTION OF THE PREFERRED EMBODIMENT

The present invention will be described in the following with reference to the accompanying drawings in connection with one preferred embodiment of the electronic component selection and supply apparatus which is to be used in the automatic electronic component inserting machine.

Figure 1:
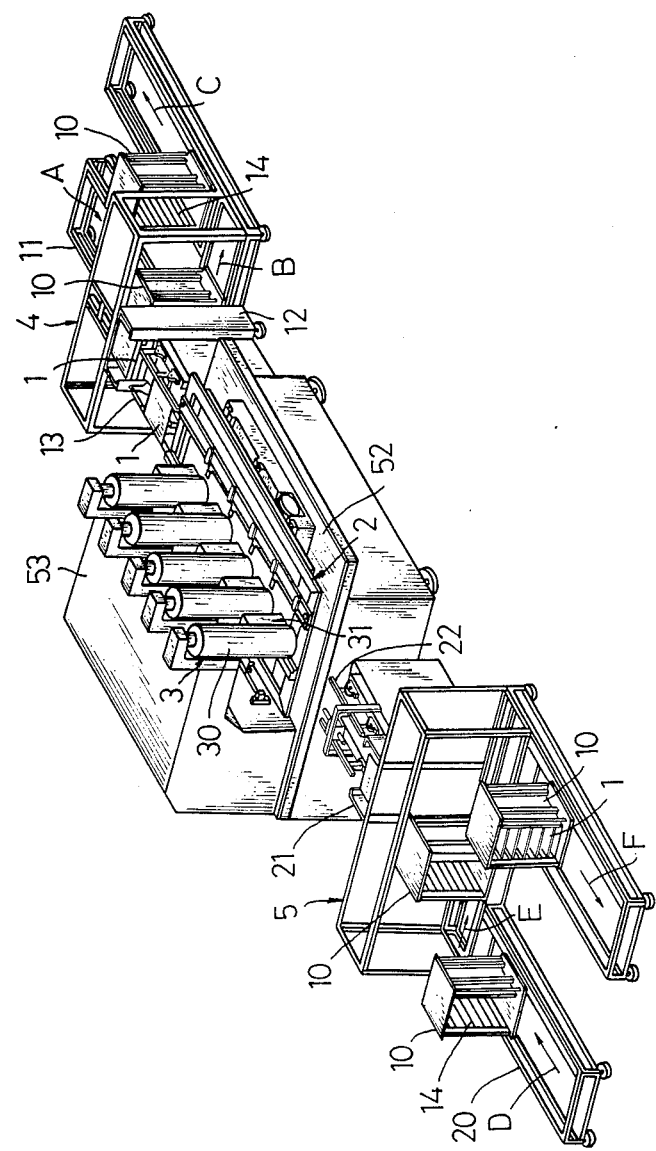
FIG. 1 is a perspective view showing the overall construction of an automatic electronic component inserting machine which is equipped with one embodiment of an electronic component selection and supply apparatus according to the present invention.

FIG. 1 shows the overall construction of the automatic electronic component inserting machine which is equipped with the embodiment of the present invention. This automatic electronic component inserting machine is equipped with: an XY table 2 on which printed circuit boards 1 are placed; an electronic component selection and supply apparatus 3 which is disposed above the XY table for selecting and supplying electronic components; inserting mechanism 31 for inserting the respective electronic components, which are selectively supplied, into the printed circuit boards 1; a board loader 4 for loading the aforementioned XY table 2 with the printed circuit boards 1; and a board unloader 5 for transferring the printed circuit boards 1 which are discharged from the aforementioned XY table 2.

The board loader 4 is equipped with a board magazine conveyor 11 for transferring board magazines 10 in a path having the shape of letter "C" in the order of arrows A, B and C, a board elevator 12 and a board conveyor 13. The board magazine 10 is formed on its inner sides with board holding guides 14 each having a number of grooves, by which the printed circuit boards 1 are supported at a predetermined spacing. The board magazine 10 accommodating a number of the printed circuit boards 10 advances in the direction of the arrow A and then turns at a right angle to the direction of the arrow B until it is stopped at position where it faces just the board elevator 12. By the action of a pusher mechanism (not shown), the plurality of printed circuit boards 1 in the board magazine 10 are pushed together into the board elevator 12. This board elevator 12 functions to hold the printed circuit boards 1 at a spacing equal to that of the aforementioned board magazine 10 and to move the printed circuit boards 1 up and down. The uppermost one of the printed circuit boards, which were elevated by elevator 12, is transferred by the pusher mechanism to the board conveyor 13. This board conveyor 13 conveys the printed circuit boards 1 one by one onto the XY table 2.

This XY table 2 is capable of positioning five printed circuit boards in a manner so as to correspond to the five electronic component selection and supply apparatuses 3 and is equipped with a desired board positioning mechanism and a board transfer mechanism for transferring only one of the printed circuit boards 1 from the right to the left.

The printed circuit board 1, into which all the electronic components have already been inserted, are delivered from the XY table 2 to the board unloader 5. This board unloader 5 has the same mechanism as that of the board loader 4 but is arranged in symmetry therewith. The board unloader 5 is equipped with a board magazine conveyor 20 for conveying the board magazines 10 in a path having the shape of letter "C" in the order of arrows D, E, and F, a board elevator 21 and a board conveyor 22. Thus, the printed circuit boards 1 delivered from the XY table 2 are consecutively conveyed by the action of the board conveyor 22 to the board elevator 21. When a predetermined number of the printed circuit boards 1 are accommodated in that board elevator 2, the plurality of printed circuit boards 1 in the board elevator 21 are pushed altogether by the action of a pusher mechanism into the empty board magazine 10 which has advanced in the course of the arrows D and E. The board magazine 10 holding the plurality of printed circuit boards 1 further advances in the direction of the arrow F until it is stopped at the end portion.

Now, the electronic component selection and supply apparatuses 3 according to the present invention are fixed on a head mounting frame 53 which is fixedly placed on a platform 52 supporting the XY table 2. Each electronic component selection and supply apparatus 3 is equipped with a cylindrical sequence device 30, and a chuck mechanism 32 for extracting the electronic components from those sequence devices 30 and for supplying and transferring them to a respective one of the aforementioned inserting mechanisms 31. In this case, five electronic component selection and supply apparatuses 3 are provided so that the five printed circuit boards 1 are accordingly placed upon the XY table 2. Moreover, the inserting operations of the electronic components by the aforementioned inserting mechanism 31 are conducted such that one of the electronic component selection and supply apparatuses 3 is so selected as to minimize the displacement of the XY table at all times. Usually, the five electronic component selection and supply apparatuses 3 are used to selectively supply different kinds of the electronic components.

Figure 2:
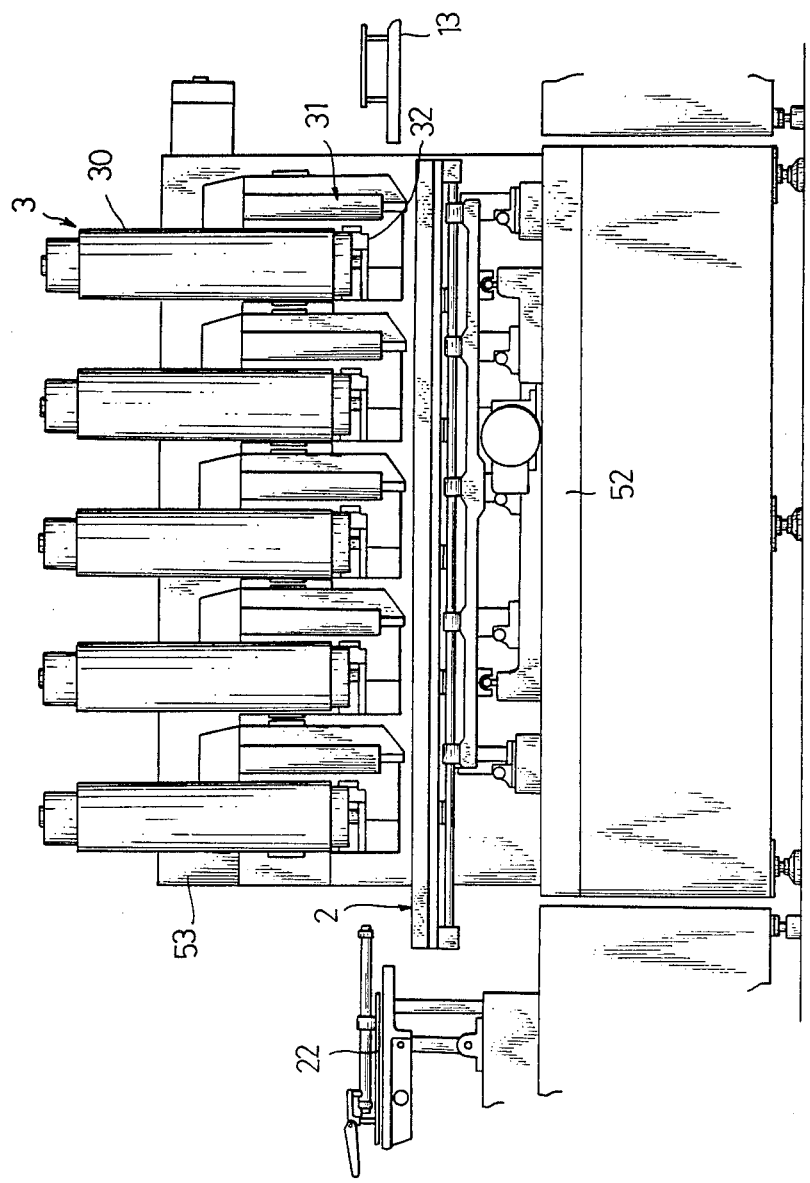
FIG. 2 is a front elevation showing an inserting mechanism and an XY table.
Figure 3:
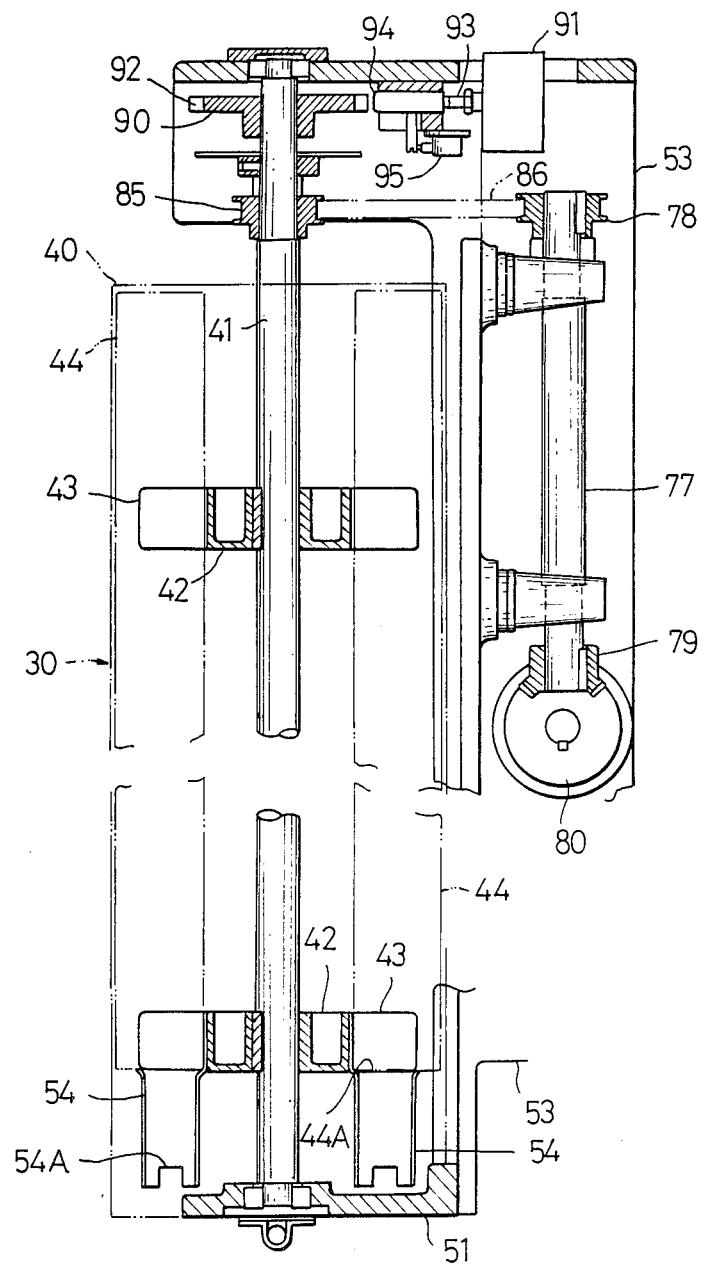
FIG. 3 is a sectional side elevation showing an electronic component sequence device.
Figure 4:
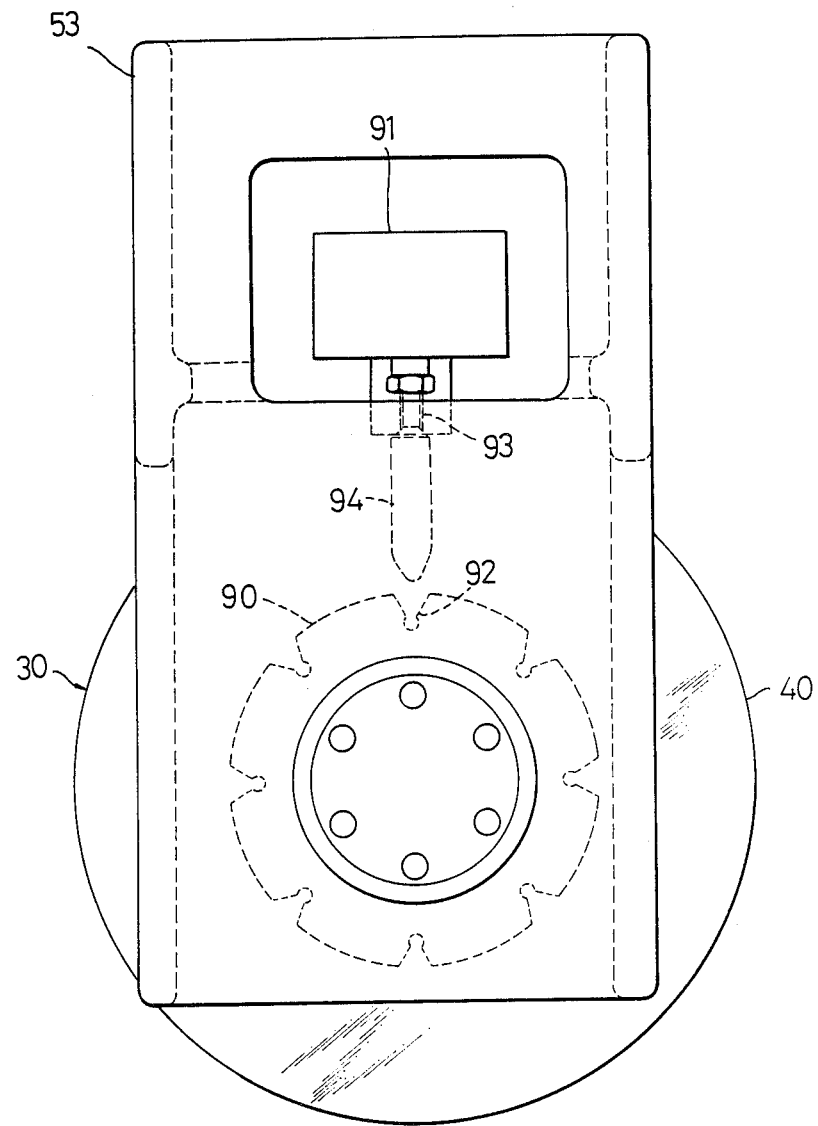
FIG. 4 is a top plan view showing the same.
Figure 5:
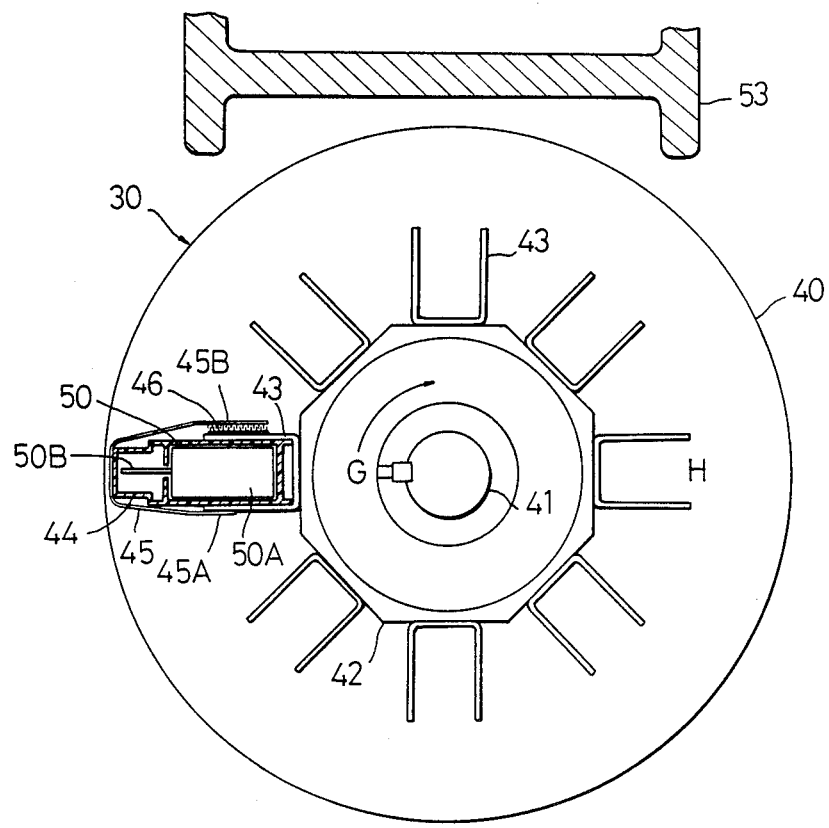
FIG. 5 is a sectional top plan view showing the same.

The aforementioned sequence device 30 functions to accommodate plural kinds of electronic components of such different shapes as are unsuitable for taping, such as electrolytic capacitors, and to select a predetermined kind from them. The details of the sequence device 30 are shown in FIGS. 3 to 7. As seen in these Figures, there extends through the center of the cylindrical outer casing 40 an intermittent rotary shaft 41, on which is fixed an intermittent rotary holder 42 having a regular polygonal (e.g., octagonal in the shown embodiment) section. To the respective sides of the intermittent holder 42, there are fixed component magazine holders 43, by which component magazines 44 are held in vertical positions and at an equal angular spacing (e.g., 45 degrees in the shown embodiment). Here, the component magazine 44 is molded of plastic or the like into a vertically extended rectangular cylinder, in which the electronic components 50, such as the electrolytic capacitors, are so accommodated in multiplicity in predetermined positions (e.g., falling sideways) in stacked states that their bodies 50A are positioned inside whereas their leads 50B are positioned outside. In order to ensure the holding of the aforementioned component magazine 44, moreover, there is fixed to the component magazine holder 43 one end 45A of a flexible band 45, the other end 45B of which is removably attached to the holder 43 by means of a fastener (e.g., a tape which is known under the tradename of "MAGIC TAPE"), as shown in FIG. 5, in a state to hold the aforementioned component magazine 44. Usually, the component magazine 44 attached to each holder 43 is used to accommodate different kinds of the electronic components 50 for each holder 43. Since, in this case, the holders 43 are mounted on the eight sides of the holder 42, eight kinds of electronic components can be accommodated in one of the sequence devices 30 so that the five sequence devices 30 can accommodate forty kinds of the electronic components as a whole. To the lower ends of the cylindrical outer casings 40 of the sequence devices 30, there are integrally connected bottom plates 51 which are fixed on the head mounting frame 53 fixedly placed on the platform 52 supporting the XY table 2, as shown in FIGS. 1 and 2. Above the bottom plate 51, moreover, there is disposed a pocket 54 which is so fixed to the lower portion of the aforementioned intermittent rotary holder 42 so as to be positioned below the aforementioned component magazine holder 43. As a result, in accordance with the intermittent rotations of the intermittent rotary holder 42, the component magazine 44 and the pocket 54 having communication with the lower opening 44A of the former are turned 45 degrees in the direction of arrow G, as shown in FIG. 5. In a manner to correspond to the lower opening 540 of the pocket 54 positioned at a point H, still moreover, the bottom plate 51 is also formed with an opening 55, from which the lowermost electronic component 50E in the pocket 54 is extracted by the action of the first chuck 56 of the chuck mechanism 32. Incidentally, the lower portion of the pocket 54 is also opened, as the aforementioned lower opening 540, but a spring mounting plate 580 is fixed on the pocket 54 and hinges a part retaining pawl 57, as shown in FIG. 8, which is biased by an extension spring 58 in a direction to protrude into the pocket 54. As a result, the electronic components 50 are usually (when the chuck 56 is not positioned) prevented from dropping while reserving a space for one electronic component in the pocket 54.

Figure 7:
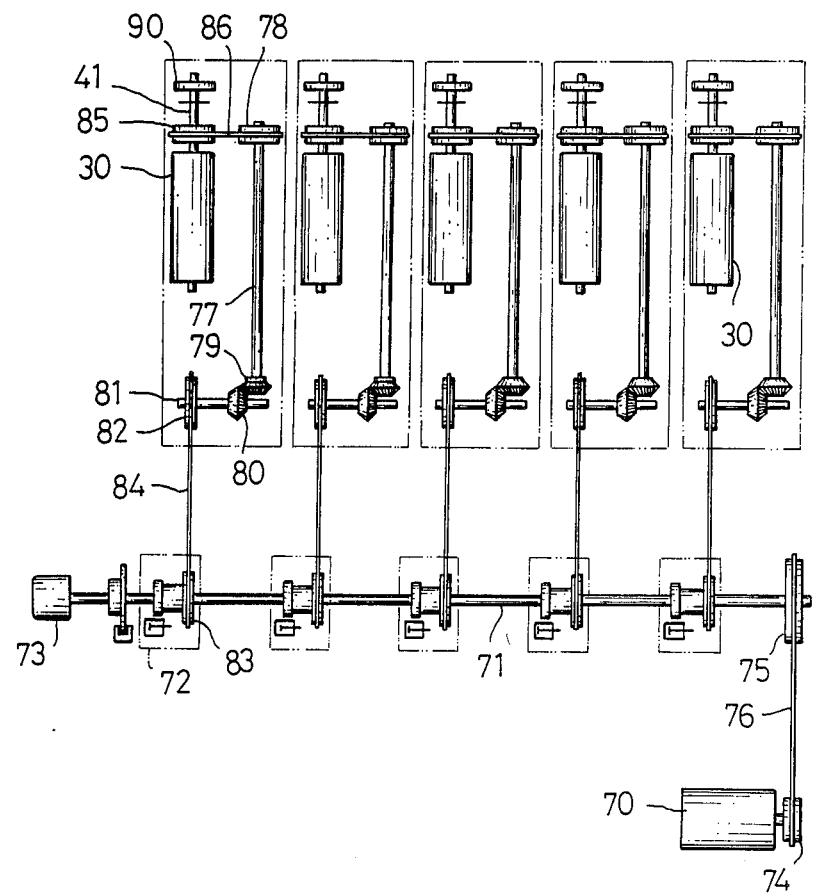
FIG. 7 is a schematic view showing a mechanism for driving each of the electronic component sequence devices.
Figure 8:
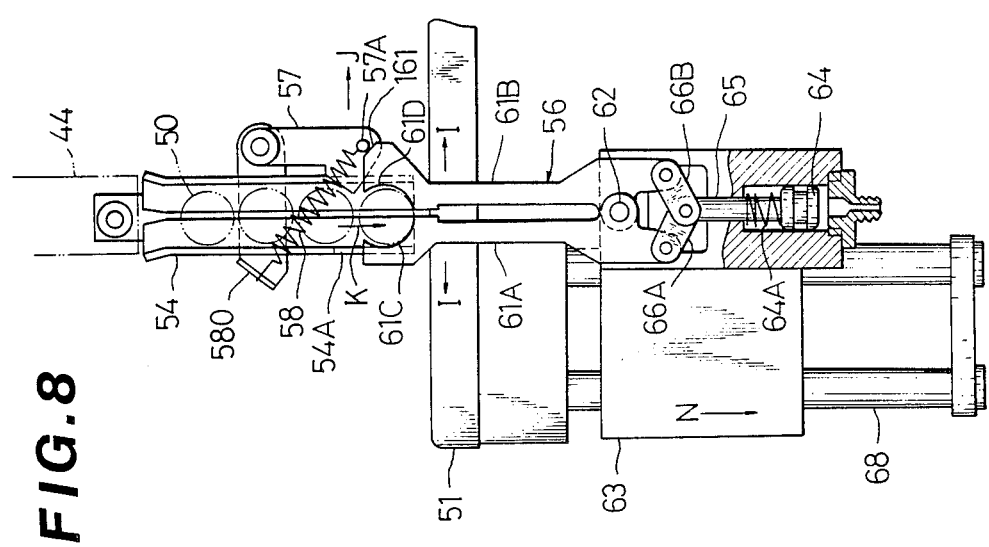
FIG. 8 is a side elevation showing a first chuck.

A mechanism for driving the intermittent rotary shaft 41 of each sequence device 30 is shown in FIG. 7. In this Figure, there are disposed at the side of the body a DC servo motor 70 and a drive shaft 71, which is equipped with a clutch 72 for each sequence device 30 as well as an encoder 73. On the servo motor 70 and the drive shaft 71, respectively, there are fixed sprockets 74 and 75 between which a chain 76 is made to run under tension. In the head mounting frame 53, on the other hand, there is borne along each sequence device a drive shaft 77 which has a pulley 78 and a bevel gear 79 fixed to the upper and lower ends thereof, respectively. Moreover, to a drive shaft 81 which is equipped with a bevel gear 80 to mesh with the bevel gear 79, there is fixed a sprocket 82, and a chain 84 is made to run under tension between that sprocket 82 and a sprocket 83 of the aforementioned clutch 72. A belt 86 is also made to run between the aforementioned pulley 78 and a pulley 85 which is fixed to the intermittent rotary shaft 41 of the sequence device 30. As a result, the rotations of the DC servo motor 70 are transmitted through the sprocket 74, the chain 76 and the sprocket 75 to the drive shaft 71 and further through the selected clutch 72, the sprocket 83, the chain 84, the sprocket 82, the drive shaft 81, the bevel gears 80 and 79, the drive shaft 77, the pulley 78, the belt 86 and the pulley 85 to the intermittent rotary shaft 41 of the predetermined sequence device 30. In this case, the intermittent rotary shaft 41 is turned 15 degrees by one rotation of the DC servo motor 70. As a result, the intermittent rotary shaft 41 is turned 45 degrees by three rotations so that the adjacent component magazine 44 is selected. Despite this construction, since the intermittent rotary shaft 41 cannot be precisely indexed only by the DC servo motor 70, an index disc 90 is fixed to the upper position of the intermittent rotary shaft 41, as shown in FIGS. 3 and 4, and an air cylinder 91 is disposed to face that index disc 90. This index disc 90 is formed with generally V-shaped retaining grooves 92 which correspond in position to the stop positions of the component magazine 44, and the aforementioned air cylinder 91 has its piston rod 93 fixing a wedge-shaped positioning rod 94 fixed to the leading end thereof. Incidentally, a micro switch 95 is disposed to detect the positioning operation of the air cylinder 91.

The electronic component supply chuck mechanism 32 extracts the electronic components, which were selected by the aforementioned sequence device 30, and transfers and supplies them to the inserting mechanism 31 which conducts the insertions of the electronic components into the printed circuit boards.

The detail of the chuck mechanism 32 is shown in FIGS. 6 and 8 to 10. This chuck mechanism 32 is equipped with both the first chuck 56 for gripping the body 50A of the electronic component 50 and for extracting it from the sequence device 30 and moving it to an intermediate position, and a second chuck 60 for gripping, at the intermediate position, the leads 50B of the electronic component 50 extracted from said first chuck 56 and for transferring it to the inserting mechanism 31.

Figure 6:
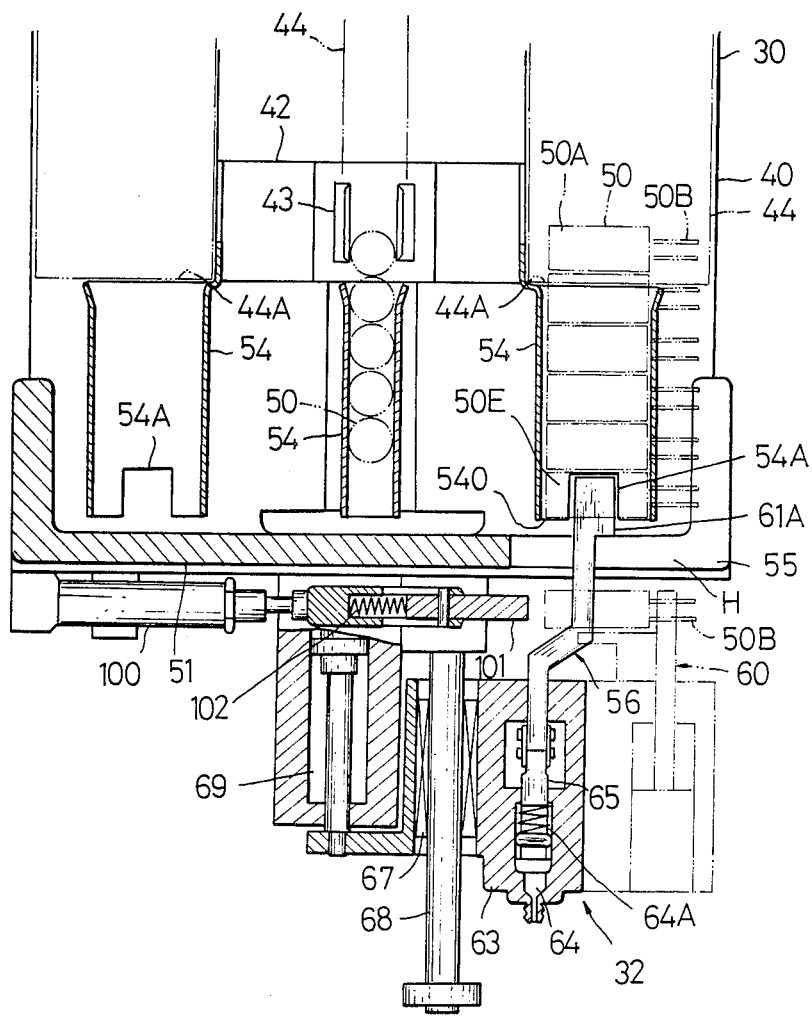
FIG. 6 is a sectional top plan view showing the bottom of the sequence device and a chuck mechanism.

The aforementioned first chuck 56 is constructed, as shown in FIG. 8, such that a pair of grip levers 61A and 61B are hinged by means of a pin 62 to a chuck mounting block 63 and have their lower ends connected through links 66A and 66B to a piston rod 65 of an air cylinder 64 which is mounted in said chuck mounting block 63. This chuck mounting block 63 also has a ball bush 67 (shown in FIG. 6) integrated therewith and is so supported as to slide up and down by means of ball bush shafts 68 which are vertically erected on the bottom plate 51 of the sequence device 30. Moreover, this vertical drive of the chuck mounting block 63 is effected by an air cylinder 69 (as shown in FIG. 6), which is mounted on the bottom plate 51. Incidentally, the side of the pocket 54 of the aforementioned sequence device 30 has its lower end portion formed with such a notched portion 54A as allows the grip levers 61A and 61B to enter thereinto. Moreover, these grip levers 61A and 61B have their leading ends formed with such semispherical recesses 61C and 61D as are circumscribed with the body 50A of the electronic component 50 to be gripped.

Figure 10:
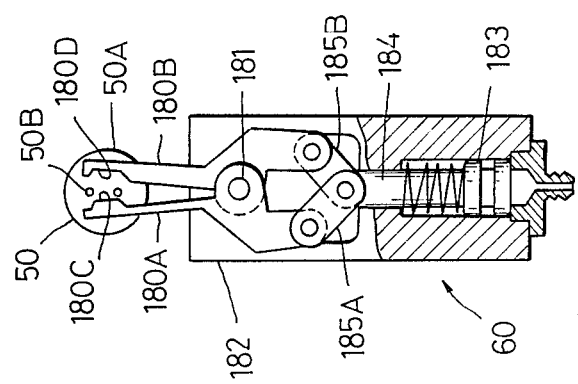
FIG. 10 is a side elevation showing a second chuck.
Figure 9:
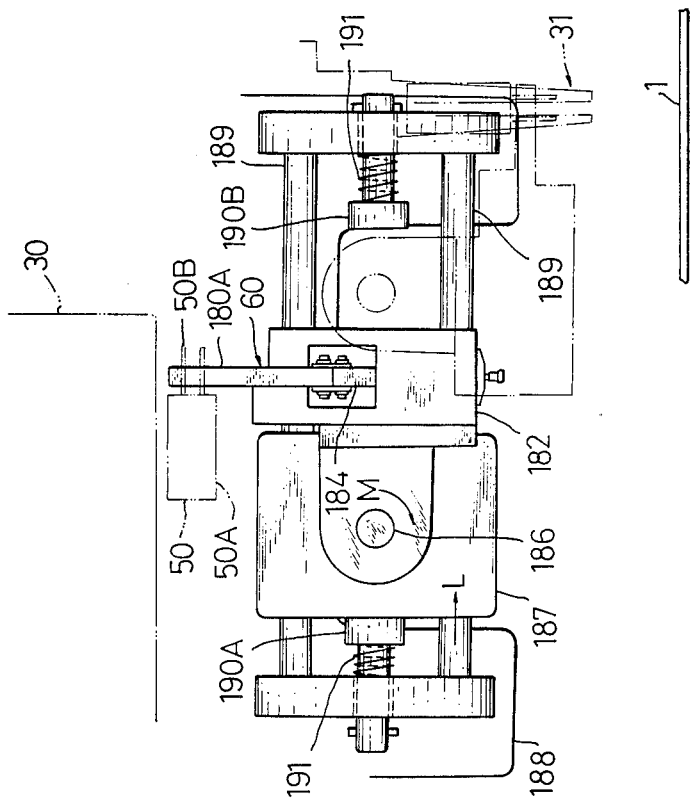
FIG. 9 is a front elevation showing a second chuck and its peripheral mechanisms.

The second chuck 60 is constructed, as shown in FIGS. 9 and 10, such that a pair of grip levers 180A and 180B are hinged by means of a pin 181 to a chuck mounting block 182 and have their rear ends connected through links 185B and 185B to a piston rod 184 of an air cylinder 183 which is mounted in said chuck mounting block 182. This chuck mounting block 182 is fixed, as shown in FIG. 9, on a rotary drive shaft 186, which is so disposed in a slider 187 as to be turned 90 degrees. On a platform 188 which is fixed at the side of the sequence device 30 and the head mounting frame 53, on the other hand, there are fixed in parallel therewith a pair of supporting shafts 189, by which the slider 187 is so supported as to freely slide in a horizontal direction, as indicated by arrow L. Incidentally, in order to regulate the moving range of the slider 187, there are disposed stopper bolts 190A and 190B, which are biased to have a cushioning effect by the action of a spring 191.

Moreover, the grip lever 180A is formed with a trapezoidal land 180C which corresponds to the spacing between the leads 50B of the electronic component 50, whereas the grip lever 180B is formed with a trapezoidal recess 180D in which that trapezoidal land 180C is to be fitted, so that the spacing between the leads 50B is precisely regulated by the coactions of the land and recess 180C and 180D.

In the construction of the embodiment thus far described, usually, the electronic component 50 in the component magazine 44 drops down into the pocket 54 by its own weight under gravity until it is caught by the component retaining pawl 57 of FIG. 8. Now, when an instruction to supply a predetermined kind of the electronic components in the electronic component sequence device 30 is generated, the DC servo motor 70 operates to turn the intermittent rotary shaft 41 a predetermined angle (which may be several times as large as 45 degrees) so that the component magazine 44 accommodating the designated electronic components is moved to the opening 55 (which is located at the point H) of the bottom plate 51. Then, the piston rod 93 of the air cylinder 91 extends so that the wedge-shaped positioning rod 94 enters into the retaining groove 92 of the index disc 90 to turn the intermittent rotary shaft 41 to a precise angular position. After the intermittent rotary shaft 41 has been stopped, the first chuck 56 of the chuck mechanism 32 is lifted, as shown in FIG. 8, to enter into the notched portion 54A which is formed in the lower portion of the pocket 54. Then, the grip levers 61A and 61B of the first chuck 56 are actuated in the opening directions, as indicated at arrows I, so as to receive the electronic component 50. This operation is executed by contracting the piston rod 65 of the air cylinder 64 by the elasticity of an inside spring 64A. Simultaneously as the grip levers 61A and 61B are opened, the leading end portion 161 of the grip lever 61B abuts against the pin 57A of the component retaining pawl 57 thereby to move that pawl 57 to the outside, as indicated at arrow J (FIG. 8). As a result, the lowermost electronic component 50 of the pocket 54 is released to drop down into the space between the semispherical recesses 61C and 61D of the grip levers 61A and 61B, as indicated at arrow K. After that, the air cylinder 64 extends the piston rod 65 by the force of its compressed air. Moreover, the air cylinder 69 extends in a state gripping the body 50A of the electronic component 50 by means of the semi-spherical recesses 61C and 61D at the leading ends of the grip levers 61A and 61D so that the chuck mounting block 63 moves down, as indicated at arrow N, until the first chuck 56 is brought down to the intermediate position where the second chuck 60 stands by. At the lower position of the first chuck 56, the leads 50B of the electronic component 50 take such a positional relationship to the second chuck 60 as is shown in FIG. 10. Specifically, the leads 50B of the electronic component 50, which is extracted from the sequence device 30 by the action of the first chuck 56, are received by the second chuck 60 while being directed upward and having their grip levers 180A and 180B opened. In this state, an air cylinder 100 for a push rod, as is shown in FIG. 6, extends to push the electronic component 50 with its push rod 101 so that the bases of the leads 50B of the electronic component 50 may be gripped without fail by the second chuck 60. In this case, the push rod 101 is biased to have a cushioning effect by the action of a spring 102. After this operation, the second air cylinder 183 of the second chuck 60 operates to close the grip levers 180A and 180B thereby to grip the leads 50B. As indicated at arrow M, the rotary drive shaft 186 (FIG. 9) is then turned 90 degrees to direct the second chuck 60 sideways. After that, the slider 187 moves horizontally to the right, as indicated at the arrow L. As a result, the electronic component 50 held by the second chuck 60 comes to the lower end position of the inserting mechanism 31.

Figure 11:
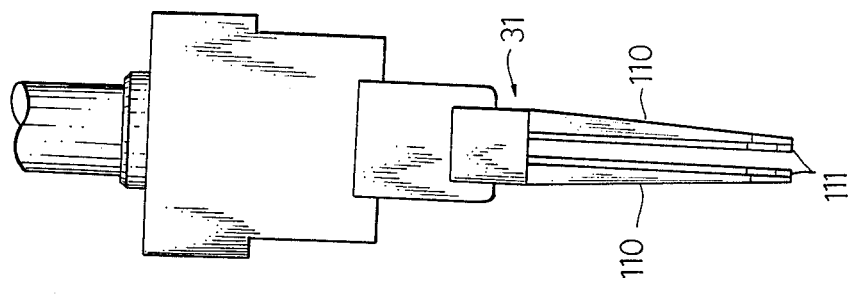
FIG. 11 is a front elevation showing an inserting mechanism.
Figure 12:
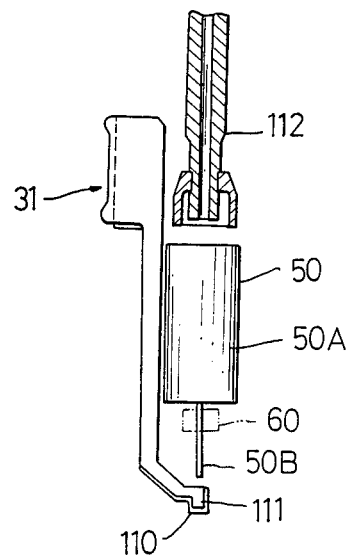
FIGS. 12 and 13 are side elevations illustrating the operations of the inserting mechanism.
Figure 13:
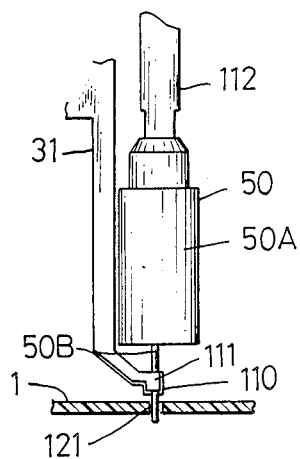

As the inserting mechanism, there can be adopted a mechanism such as those which are disclosed in U.S. Pat. Nos. 4,054,988, 4,196,513, 4,294,000, and 4,320,574. As shown in FIGS. 11 to 13, one example is equipped with both a pair of outer and inner grip members 110 and 111, which are arranged at a spacing equal to that between the leads 50B of the electronic component 50, and a push rod 112 adapted to hold the body 50A of the electronic component 50 under suction. The aforementioned outer and inner grip members 110 and 111 can be so opened and closed that they form such a groove at their lower end portions in their closed, positions as can grip the leads 50B. From the condition shown in FIG. 12, the electronic component 50 has its body 50A suctioned and held by the action of the push rod 112 and its leads 50B gripped by the outer and inner grip members 110 and 111 and is moved down, as shown in FIG. 13, until its leads 50B are automatically inserted into the component receiving hole 121 of the printed circuit board 1.

Next, the overall operation of the embodiment having the construction thus far described will be described in the following. The board magazine 10 accommodating a number of the printed circuit boards 1 on the board loader 4 before the component insertions advance in the order of the arrows A and B until it is stopped at a position to face the board elevator 12. At this position, the numerous printed circuit boards 1 in the board magazine 10 are transferred together onto the board elevator 12. From this board elevator 12, the printed circuit boards 1 are supplied one by one to the board conveyor 13 and are then conveyed by means of the board conveyor 13 onto the XY table 2, in which they are subjected to a predetermined positioning operation. After that, the selection, supply and insertion of the components are executed by the coactions of the electronic component selection and supply apparatuses 3 and the inserting mechanism 31. On the XY table 2, there are usually positioned the five printed circuit boards 1 which correspond to the, number of the electronic component selection and supply mechanisms 3 and the inserting mechanisms 31, by which the components are respectively inserted.

The selection of the electronic components 50 to be inserted is conducted by the turns of the intermittent rotary holder 42 of the sequence device 30, and the component magazine 44 accommodating the desired electronic components 50 is so controlled that it is positioned at the point H of the righthand end of the sequence device 30. The electronic component 50, which is selected from the pocket 54 below the component magazine 44 at the point H, is extracted, while having its body 50A gripped by the first chuck 56 of the chuck mechanism 32, and is transferred and supplied to the inserting mechanism 31 while having its leads 50B gripped by the second chuck 60. Then, the desired electronic component 50 is inserted into the printed circuit board 1 by the action of the inserting mechanism 31. These inserting operations are repeatedly executed by suitably selecting the electronic component selection and supply apparatus 3 and the inserting mechanism 31 in such an order as to minimize the displacement of the XY table 2.

The printed circuit boards 1, into which all the components have been inserted, are discharged from the XY table 2 and are held in stacked states in the board elevator 21 after they have been conveyed by the board conveyor 22 of the board unloader 5. Moreover, when the printed circuit boards 1 fully occupy the board elevator 21, the numerous boards 1 are transferred altogether to the empty board magazine 10 facing that elevator 21 so that the board magazine 10 holding the printed circuit boards having received the components is conveyed, as indicated at the arrow F, to the end portion of the board magazine conveyor 20.

According to the embodiment thus far described, the present invention has the following advantages.

By making use of the component magazine 44 in which the electronic components 50 are held in the predetermined positions and in the stacked states, the taping can be eliminated, and the electronic components having different shapes such as the electrolytic capacitors or the power transistors, which have such external diameters as are unsuitable for the taping, can be automatically selected and supplied to the inserting mechanisms.

By the use of the sequence devices 30, the plural component magazines 44 are erected so that one of them may be selected. As a result, one kind can be selected at a high speed from the numerous kinds of electronic components of different shapes so that they can be supplied one by one, whereby the usability of the apparatus of the present invention can be improved.

Since the extraction of the electronic component 50 from the sequence device 30 is conducted by means of the first chuck 56 for gripping the body 50A of the component 50, the leads 50B can be prevented from being warped during the extracting operation.

The second chuck 60 cannot only grip the leads 50B of the electronic component 50 by means of its paired grip levers 180A and 180B but also precisely regulate the spacing between the leads 50B by the coactions of the trapezoidal land and recess 180C and 180D at the leading ends of the grip levers 180A and 180B.

Incidentally, the foregoing description of the embodiment is directed to the case in which the electronic component 50 has two leads 50B. It is, however, apparent that the automatic electronic component selection and supply can be ensured by slightly changing the second chuck 60 even in the case where the electronic component has three leads.

As has been described hereinbefore, according to the present invention, it is possible to provide the electronic component selection and supply apparatus for use in the automatic electronic component inserting machine which can automatically select and supply many kinds of electronic components of different shapes.

Obviously, numerous modifications and variations of the present invention are possible in the light of the above teachings. It is therefore to be understood that within the scope of the claims, the invention may be practiced other than as specifically shown herein.

What is claimed is:

1. In a machine for processing and inserting electronic components into lead receiving openings in a printed circuit board,
a selection and supply apparatus for selecting and moving an electronic component to a first position and supplying said selected electronic component to a second predetermined position, comprising:
electronic component sequence means for selecting a predetermined electronic component, said sequence means including a shaft mounted for intermittent rotation, a plurality of substantially vertical electronic component magazines coupled to said shaft at locations therearound, adjacent pairs of magazines being mutually spaced from each other by equal angular distances, each of said magazines adapted to accommodate a plurality of substantially vertically stacked electronic components therein, and intermittently activated drive means for rotating said shaft through angles equal to an integral multiple of said angular distance between adjacent magazines in response to an instruction to supply a predetermined kind of electronic component to the first position located below or at the bottom of a corresponding one of said electronic component magazines to thereby situate a lowermost one of the electronic components in any of said magazines which constitutes the predetermined kind of component in the first position; and
chuck means for receiving the predetermined electronic component which was selected by said electronic component sequence means and moved to said first position and for supplying said electronic component to said second predetermined position, said chuck means including a first chuck for gripping a body of the selected electronic component to extract the same from said first position and move the same to an intermediate position, and a second chuck for gripping a lead of the electronic component at said intermediate position and moving the component to said second predetermined position, said first chuck being movable in a longitudinal direction of the corresponding one of said electronic component magazines.

2. A selection and supply apparatus as set forth in claim 1, wherein said first chuck has a pair of grip levers for gripping the body of said electronic component, and wherein said second chuck has a pair of grip levers for gripping the leads of the electronic component which has its body gripped by said first chuck and is swingable and movable in a direction which is perpendicular to the longitudinal direction of the corresponding one of said electronic component magazines.

3. A selection and supply apparatus as set forth in claim 1, wherein said electronic component sequence means further includes an intermittent rotary holder having a regular polygonal section fixedly mounted on said intermittent rotary shaft, and electronic component magazine holders fixed on the respective sides of said intermittent rotary holder.

4. A selection and supply apparatus as set forth in claim 3, wherein said electronic component magazine holders have holding bands mounted thereon for ensuring the holding of said electronic component magazines.

5. A selection and supply apparatus as set forth in claim 3, further including pockets located at predetermined angular spacings to communicate with lower openings in said magazines, and wherein said pockets are fixed to the lower portion of said intermittent rotary holder and are disposed at positions below and corresponding to the electronic component magazine holders which are secured to said intermittent rotary holder.

6. A selection and supply apparatus as set forth in claim 3, wherein each of said pockets has a stopper for usually preventing said electronic component from dropping from said pocket and for holding said electronic component in a state where a space for one electronic component is formed in said pocket.

7. A selection and supply apparatus as set forth in claim 6, wherein said stopper has a spring mounting plate fixed on said pocket, a component retaining pawl hinged to said spring mounting plate, and a spring mounted between said component retaining pawl and said spring mounting plate for biasing said component retaining pawl in a direction to enter into the inside of said pocket.

8. A selection and supply apparatus as set forth in claim 1, further comprising positioning means for positioning said intermittent rotary shaft, including: an index disc fixed on said intermittent rotary shaft and formed with a retaining groove in its circumference; and an air cylinder disposed to face said index disc and having a piston rod carrying a positioning rod at its leading end.

9. A selection and supply apparatus as set forth in claim 2, wherein the paired grip levers of said first chuck are hinged through a pin to a chuck mounting block and have their rear ends connected through links to the piston rod of an air cylinder which is formed in said chuck mounting block.

10. A selection and supply apparatus as set forth in claim 2, wherein the paired grip levers of said second chuck are hinged through a pin to a chuck mounting block and have their rear ends connected through links to the piston rod of an air cylinder which is formed in said chuck mounting block.

11. A selection and supply apparatus as set forth in claim 10, wherein said chuck mounting block is fixed on a rotary drive shaft which is rotatably carried in a slider.

12. A selection and supply apparatus as set forth in claim 2, wherein the paired grip levers of said first chuck are formed at their respective leading ends with semi-spherical recesses which are circumscribed with the body of said electronic component.

13. A selection and supply apparatus as set forth in claim 2, wherein one of the paired grip levers of said second chuck is formed at its leading end with a trapezoidal land for regulating the spacing between the leads of said electronic component whereas the other is formed at its leading end with a trapezoidal recess.

14. A selection and supply apparatus as set forth in claim 7, wherein said first chuck comprises a pair of grip levers, and one of the paired grip levers of said first chuck is formed at its leading end with an engagement portion which is made engageable with said component retaining pawl thereby to release the retention of said electronic component by said component retaining pawl.

15. A selection and supply apparatus as recited in claim 1 wherein said plurality of magazines are adapted to accommodate different kinds of electronic components.

* * * * *